(12) United States Patent
Christophersen et al.

(10) Patent No.: US 9,997,555 B2
(45) Date of Patent: Jun. 12, 2018

(54) FABRICATION METHOD FOR DIGITAL ETCHING OF NANOMETER-SCALE LEVEL STRUCTURES

(71) Applicant: UNITED STATES OF AMERICA, AS REPRESENTED BY THE SECRETARY OF THE NAVY, Washington, DC (US)

(72) Inventors: Marc Christophersen, Berwyn Heights, MD (US); Bernard F. Phlips, Great Falls, VA (US); Michael K. Yetzbacher, Burke, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days. days.

(21) Appl. No.: 15/597,222

(22) Filed: May 17, 2017

(65) Prior Publication Data

US 2018/0040654 A1  Feb. 8, 2018

Related U.S. Application Data

(60) Provisional application No. 62/369,812, filed on Aug. 2, 2016.

(51) Int. Cl.
*H01L 21/00* (2006.01)
*H01L 27/00* (2006.01)
(Continued)

(52) U.S. Cl.
CPC ........ *H01L 27/14625* (2013.01); *G02B 6/136* (2013.01); *H01L 21/02104* (2013.01);
(Continued)

(58) Field of Classification Search
CPC ......... H01L 21/02104; H01L 21/31144; H01L 21/316; H01L 27/14625; H01L 27/14685;
(Continued)

(56) References Cited

U.S. PATENT DOCUMENTS 5,073,007 A    12/1991  Kedmi et al.
5,974,162 A *  10/1999  Metz .................... A61B 5/1172
                                                356/71
(Continued)

OTHER PUBLICATIONS

Renlund et al., "Silicon oxycarbide . . . ", 1999, J. Mater. Res., vol. 6 No. 12 pp. 27-23, Dec. 1999.*
(Continued)

*Primary Examiner* — Nikolay Yushin
(74) *Attorney, Agent, or Firm* — US Naval Research Laboratory; Suresh Koshy

(57) ABSTRACT

A device includes a surface profile optical element, including a substrate and a plurality of bi-layer stacks on the substrate. Each bi-layer stack of the plurality of bi-layer stacks includes a plurality of bi-layers. Each bi-layer of the plurality of bi-layers includes an etch-stop layer and a bulk layer. The etch stop layer includes an etch stop layer index of refraction. The bulk layer includes a bulk layer index of refraction. A ratio of the etch stop layer index of refraction and the bulk layer index of refraction is between 0.75 and 1.25.

19 Claims, 21 Drawing Sheets

(51) Int. Cl.
  *G02B 6/136* (2006.01)
  *H01L 27/146* (2006.01)
  *H01L 21/311* (2006.01)
  *H01L 21/02* (2006.01)
  *G02B 6/12* (2006.01)

(52) U.S. Cl.
  CPC .. *H01L 21/31144* (2013.01); *H01L 27/14685* (2013.01); *G02B 2006/12085* (2013.01); *G02B 2006/12102* (2013.01); *G02B 2006/12176* (2013.01)

(58) Field of Classification Search
  CPC ......... H01L 27/12; G02B 6/136; G02B 6/122; G02B 6/43; G02B 2006/12085; G02B 2006/12102; G02B 2006/12176; G02B 2006/12147; G02B 2006/12002; G02B 2006/1223
  See application file for complete search history.

(56) References Cited

U.S. PATENT DOCUMENTS

| | | |
|---|---|---|
| 6,157,488 A | 12/2000 | Ishii |
| 6,822,796 B2 | 11/2004 | Takada et al. |
| 7,115,993 B2 * | 10/2006 | Wetzel .............. H01L 21/76802 257/758 |
| 2005/0167839 A1 * | 8/2005 | Wetzel .............. H01L 21/76802 257/758 |

OTHER PUBLICATIONS

SiO2 refractive index—https://refractiveindex.info/?shelf=main&book=SiO2&page=Malitson undated.*

Daschner, et al., Cost-effective Mass Fabrication of Multilevel Diffractive Optical Elements by Use of a Single Optical Exposure with a Gray-scale Mask on High-Energy Beam-sensitive Glass, Applied Optics, Jul. 10, 1997, pp. 4675-4680, vol. 36, No. 20, OSA The Optical Society, Washington, DC, USA.

Zeitner, U.D., Micro- and Nan-Technology . . . for Optics 3.2 Lithography, Friedrich-Schiller Institute of Applied Physics and Fraunhofer Institute Applied Optics and Precision Engineering IOF, 2014, Jena, Germany.

SUSS MicroOptics Company Presentation, SUSS MicroOptics SA, 2016, Neuchatel, Switzerland.

Kress, Bernard, Digital Optics: From micro-optics to nan-photonics, Silicon Valley Forum, May 2012, Google X labs, Mountain View, CA, USA.

Grossinger, Tamir, Recent Optical Solutions With Diffractive Optical Technology, Ben Gurdion University of the Negev, (unknown publication date), Be'er Sheva, Israel.

* cited by examiner

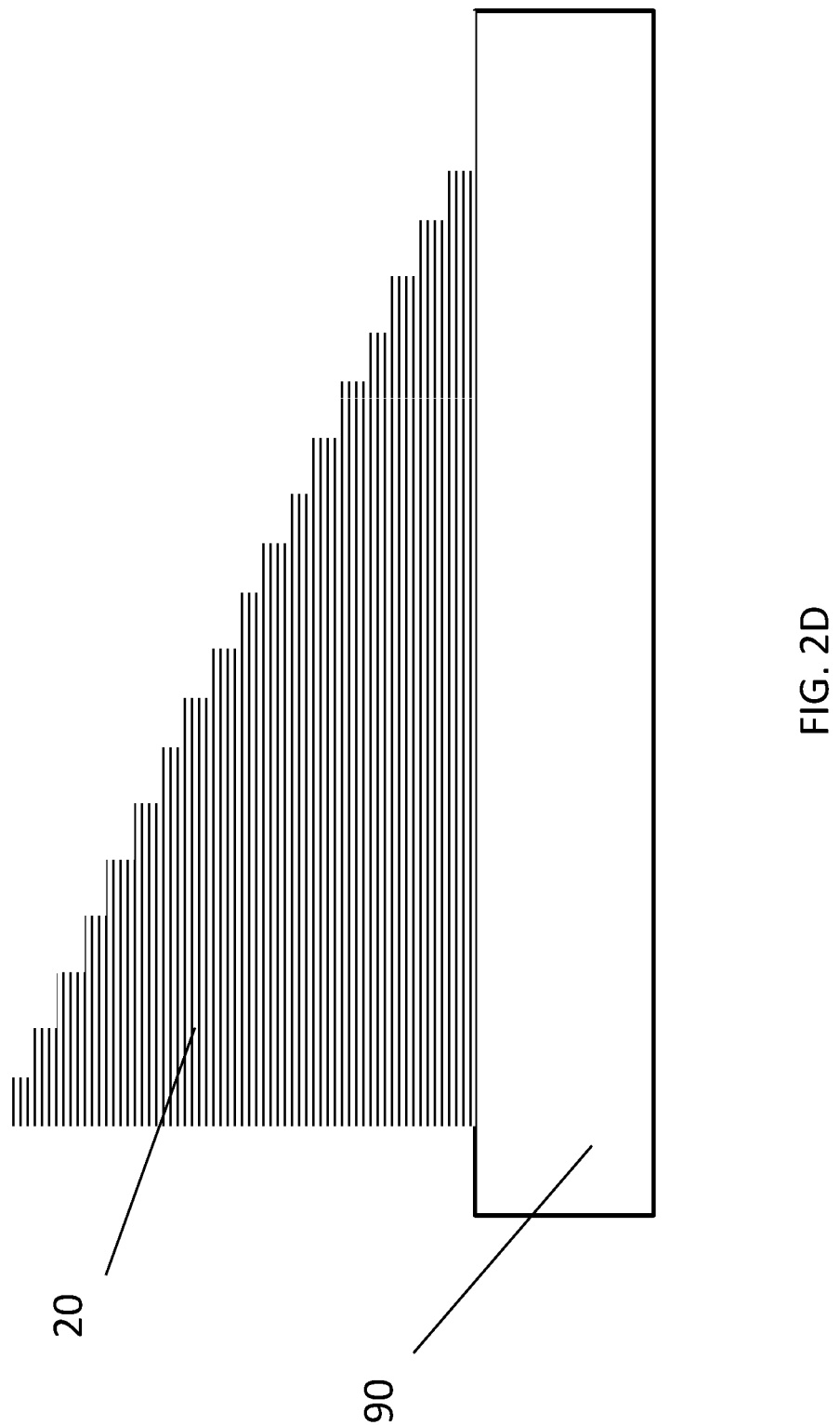

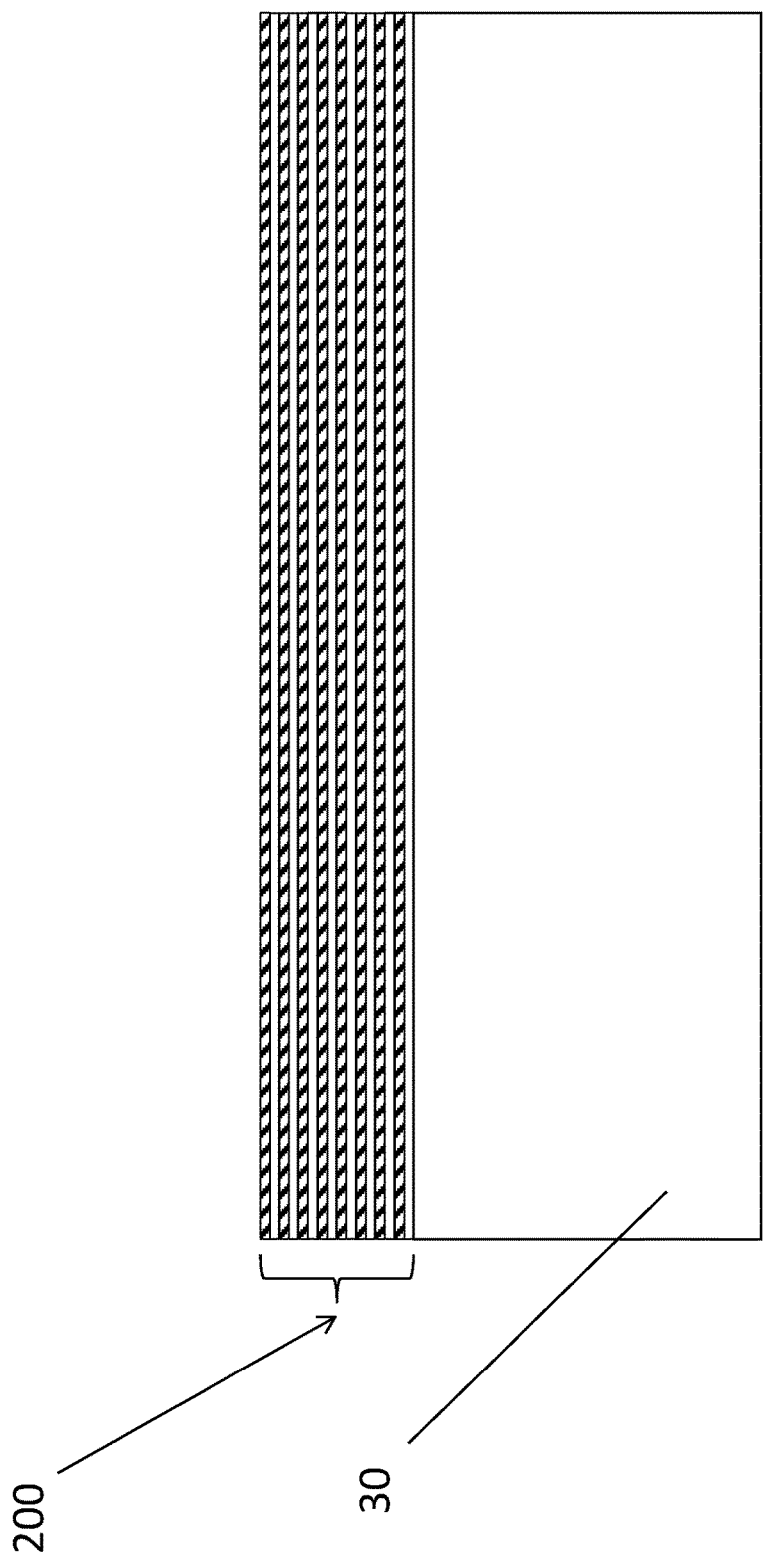

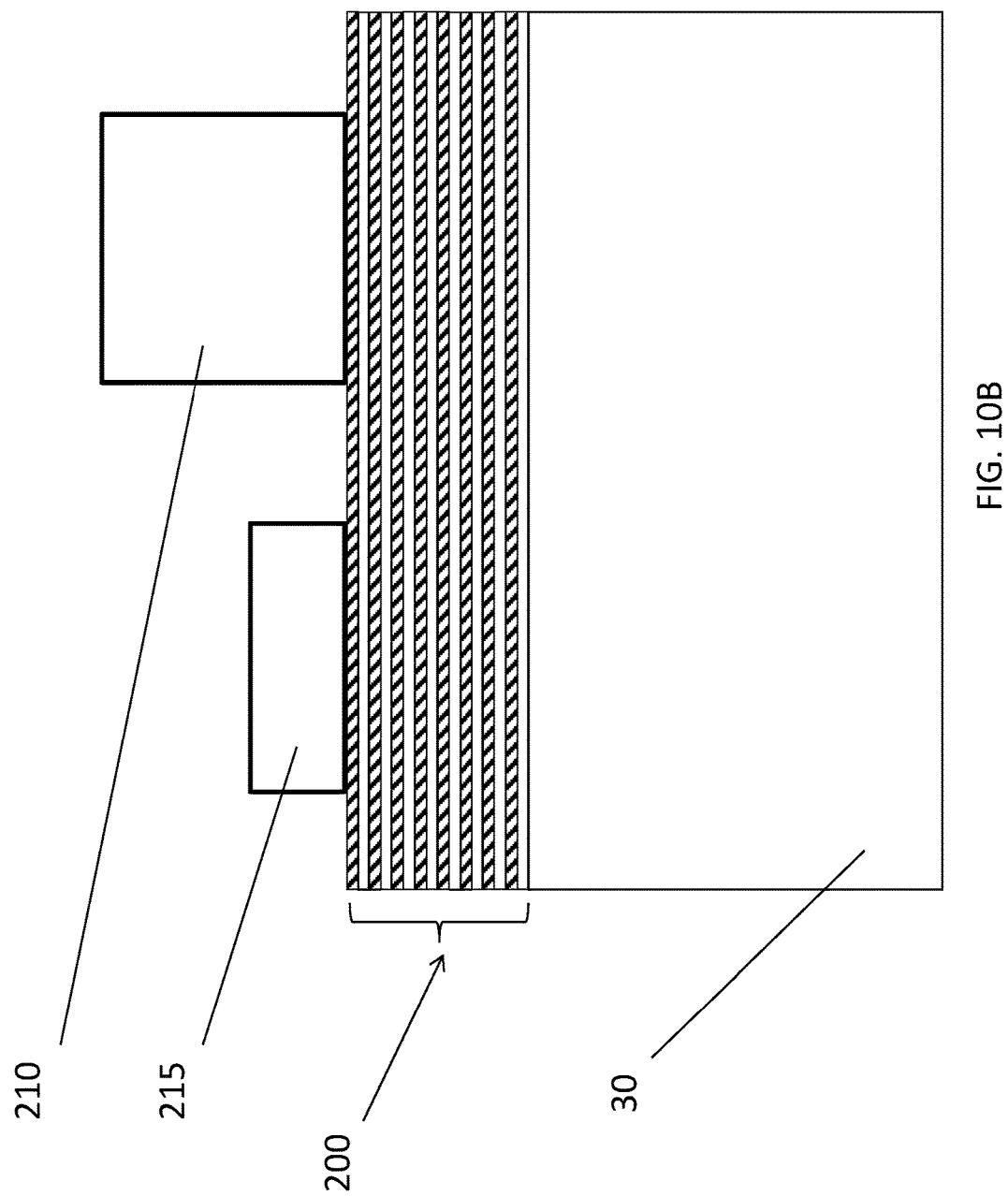

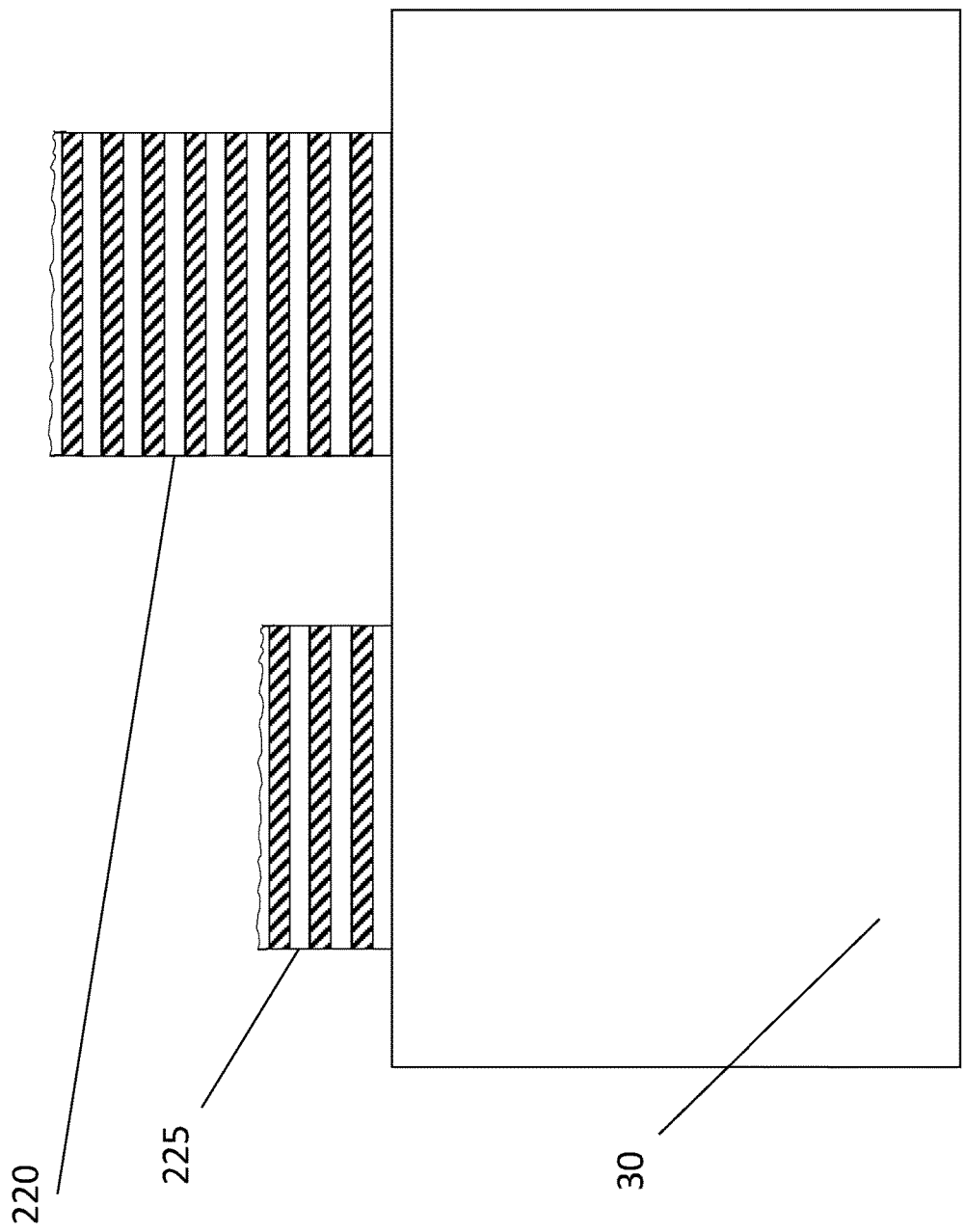

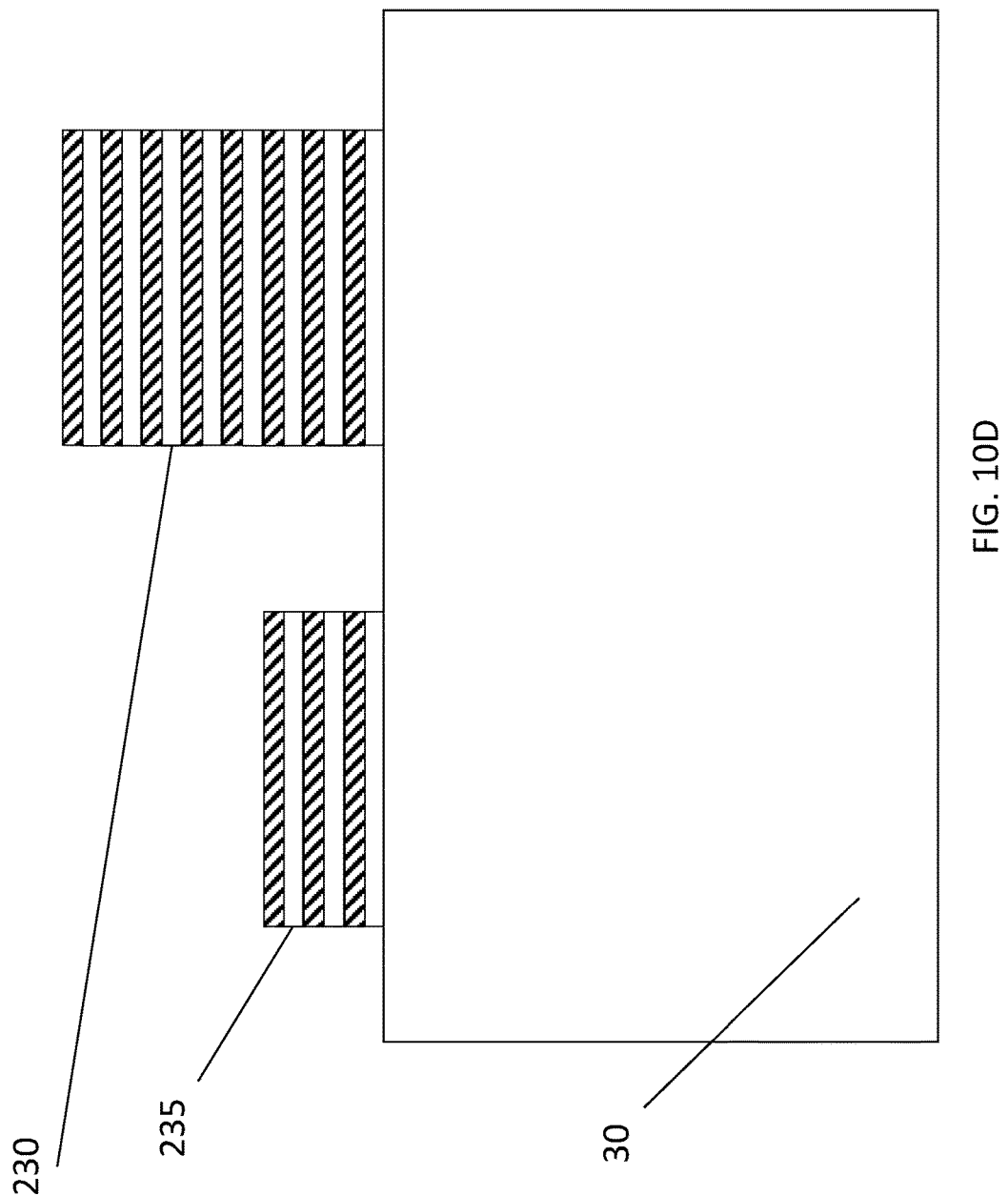

FABRICATION METHOD FOR DIGITAL ETCHING OF NANOMETER-SCALE LEVEL STRUCTURES

CROSS-REFERENCE TO RELATED APPLICATIONS

The present application claims priority to U.S. Provisional Patent Application Ser. No. 62/369,812, which was filed on 2 Aug. 2016 and which is incorporated herein by reference.

FIELD OF THE INVENTION

The present invention relates in general to nanometer-scale level structures and methods of making and using same, and in particular to surface profile optical elements having nanometer-scale level structures and methods of making and using same.

BACKGROUND OF THE INVENTION

Diffractive optical elements ("DOE") are used in many applications, such as optical storage devices, processing, sensing, and communications. A DOE serves to wave-shape incoming light. Whereas standard refractive optical elements, such as mirrors and lenses, are often bulky, expensive and limited to a specific use, DOEs are generally light-weight, compact, easily replicated, and can modulate complicated wavefronts.

A Fresnel lens is an example for a DOE. Like a classical convex lens, the Fresnel lens focuses parallel light onto a single focal point. The Fresnel lens' design can be considered conceptually as being created by removing slabs of glass that do not contribute to the bending of light rays to the focal point. Conventional Fresnel lens fabrication requires that the lens profile needs to be etched into, for example, a glass wafer. This fabrication is done by step-wise. The first etched profile, a so-called Fresnel plate, is not a good approximation of the ideal Fresnel shape. A conventional Fresnel plate is only ~41% effective (i.e., only around 41% of transmitted light gets focused).

Other examples of DOEs include beam shapers, e.g., beam homogenizers. A DOE can also encode complex structures, which produce visible images in the far field when the light passes through the DOE structure. The fabrication of a DOE, which encodes the images, is a rather complex process. The gray-scale level of each image pixel is encoded by the phase shift of the light which passes through the DOE. This is achieved by encoding the depth of the features, which are etched in clear dielectric.

A typical DOE's consists of many features with a typical size of 7 μm, with depths varying continuously between 0 and 600 nm, to produce a phase shift between 0 and $\pi$ for a 632 nm irradiation wavelength. The depth of the etched features must be precisely fabricated, and the etch roughness must be as low as possible. For example, the roughness of the etched features for a DOE, which encodes an image with 16 colors, must be smoother than 30 nm.

The three-dimensional ("3D") surface profile of the DOE determines how the element will shape an incoming wavefront. Hence, the key feature of any DOE is its complicated 3D surface topography. Some gratings can be blazed or cut, but most DOE are made by micro-fabrication techniques. This usually involves a lithography step and an etching step: A photo-sensitive resist layer is applied and exposed with a mask under ultra violet ("UV") light. After developing, the mask pattern is transferred into the resist layer. The resist layer then defines where material is etched away. This is normally done with reactive ion etching ("RIE"). The step depth is defined by resist layer profile and the RIE etch recipe.

Multiple levels are made by multiple photo-lithography and etching steps in standard, multilevel fabrication methods. However, such standard, multilevel fabrication methods work better in theory than in practice. For example, the use of multi photo-masks is a challenge because each mask must be aligned with respect to the previous etch step. The alignment is never perfect, generating displacements in x- and y-directions and rotational errors. With the number of lithography and etching step cycles the alignment errors add up. This is the reason why most DOEs only have 8-16 step levels. The theoretical efficiency (i.e., the fraction of the light that gets focused s) for a DOE with 8 steps and without fabrication errors like misalignment or surface roughness is no better than 95%. Fabrication errors will reduce this efficiency and further degrade optical performance. Increasing the number of steps in theory will increase the efficiency, but in practice, fabrication errors have been found to reduce the efficiency with larger effect.

An alternative, conventional micro-fabrication method to fabricate 3D profiles includes the use of standard gray-tone lithography. Gray-tone lithography (also known as gray-scale lithography) is a standard lithography process that results in continuously variable resist profiles. A gray-tone optical mask is used to transmit only a portion of the intensity of incident light, partially exposing sections of a positive photoresist to a certain depth. This exposure renders the top portion of the photoresist layer more soluble in a developer solution, while the bottom portion of the photoresist layer remains unchanged. The number of resolvable levels in gray-tone lithography has been limited by photoresist exposure nonlinearity, variability in development and material homogeneity to commonly around 16 levels under common conditions. With careful attention to detail, it is possible to achieve gray-tone lithography resolution of up to ~80 levels. Continuous structures can be produced by heating the photoresist to smooth out surface non-uniformity.

The developed photoresist may be processed, for example by etching, to reproduce a scaled version of the three dimensional structure on the substrate. As the etch proceeds, the photo-resist mask slowly erodes, exposing the underlying dielectric to the high etch rate plasma. Thus, gray-scale technology relies on specifically developed RIE recipes to control the relative etch rate of the substrate called "etch selectivity". This aspect defines the final vertical dimensions of a 3D structure.

There are multiple, standard methods for generating a gray-tone resist structure: diffuser-based, direct-writing (e.g. with a laser or electron beam), exposure through a High Energy Beam Sensitive ("HEBS") glass mask, and traditional stepper exposure. Direct writing and stepper exposures can have so called "stitching errors", because only a small field-of-view is exposed and multiple fields are stitched together. All gray-tone lithography methods have problems generating sharps drops or steps. Inevitably produced "transition regions" at the tops and bottom of steps scatter light and, therefore, degrade the DOE performance. Furthermore, for all gray-tone methods, the number of levels is limited to maximal ~80.

All of the above-described techniques (e.g., multiple lithography/etching step cycles and gray-tone methods) have one additional and fundamental limitation: RIE etching is known to create surface non-uniformities or roughness, due to the random nature of the etching process and material inhomogeneity. This surface roughness will lead to scattering and degrade the DOE performance. The effect of the RIE-introduced roughness on DOEs depends on the wavelength of light. The shorter the wavelength is, the smaller the surface roughness must be.

BRIEF SUMMARY OF THE INVENTION

An embodiment of the invention includes a device that includes a surface profile optical element, including a substrate and a plurality of bi-layer stacks on the substrate. Each bi-layer stack of the plurality of bi-layer stacks includes a plurality of bi-layers. Each bi-layer of the plurality of bi-layers includes an etch-stop layer and a bulk layer. The etch stop layer includes an etch stop layer index of refraction. The bulk layer includes a bulk layer index of refraction. A ratio of the etch stop layer index of refraction and the bulk layer index of refraction is between 0.75 and 1.25.

Another embodiment of the invention includes a method of fabricating a multiple-step, surface profile optical element. A stack of bi-layers is deposited on a substrate. The stack of bi-layers includes a plurality of bi-layers. Each bi-layer of the plurality of bi-layers includes an etch stop layer and a bulk layer. The etch stop layer and the bulk layer have respective indices of refraction that approximate each other. For example, a ratio of the etch stop layer's index of refraction and the bulk layer's index of refraction is between 0.75 and 1.25. A three-dimensional photoresist structure is formed by using gray-tone lithography. The three-dimensional photoresist is plasma etched into the bi-layer stack, thereby generating at least one plasma-etched bi-layer stack. For example, the plasma etching includes reactive ion etching (or other equivalent standard etching process, such as standard ion milling). The at least one plasma-etched bi-layer stack is chemically etched with a first chemical etchant so as to generate a multiple-step, surface profile optical element. The first chemical etchant stops at the etch stop layer. Optionally, a second chemical etch is used for the bulk layer, e.g., a standard phosphoric acid-based solution used to etch alumina.

Optionally, the multi-step, surface profile optical element fabricated according to the method embodiment described above is provided as a mold master. A coating, or mold solution, is applied onto the mold master. Optionally, the coating includes a polymer, a plastic, a ceramic, and/or a glass. The coating is solidified. The solidified coating is removed, thereby generating a surface profile optical element-imprinted mold.

An embodiment of the invention includes a method for fabrication of precise DOE that circumvents the need for multiple lithography steps and increase number of surface steps to, for example, over 100. Since a single lithography step is used, there are no alignment errors, improving the DOE performance while simplifying its fabrication. Furthermore, the resulting final surface is much smoother, when compared with traditional DOE segments. This reduces scattering from surface roughness, improving the overall performance.

For aspherical elements and some wavefront coding elements, a continuous surface is fabricated. This fabrication process is expensive, but has been developed to achieve increased optical performance, increased mechanical or thermal precision tolerance, or reduction in size and weight relative to traditional optical designs. The continuous surface means that light enters or exits the element at a variety of angles, leading to a range of reflection angles and difficulty in designing anti-reflection coatings. Potential performance benefits exist for digitizing these surfaces so that the incoming or outgoing beams would see a single angle for the optic surface. Our invention allows for the fine control of a digitized surface through deposition of a layered meta-material and subsequent etch steps.

BRIEF DESCRIPTION OF THE DRAWINGS

FIG. 2D is a cross-sectional view of an illustrative device including a semiconductor device according to an embodiment of the invention.

FIG. 10A is a cross-sectional view of an illustrative stack of bi-layers having been deposited on an illustrative substrate in a method according to an embodiment of the invention.

FIG. 10B is a cross-sectional view of an illustrative mask being used in a gray-tone lithography step of a method according to an embodiment of the invention.

FIG. 10C is a cross-sectional view of an illustrative post-reactive-ion-etched structure in a method according to an embodiment of the invention.

FIG. 10D is a cross-sectional view of an illustrative, post-chemical-etching, surface profile optical element in a method according to an embodiment of the invention.

DETAILED DESCRIPTION OF THE INVENTION

The invention relates to micro-fabrication of surface profile optical elements, such as precise standard wavefront coding elements, standard aspheric optical elements, and standard diffractive optical elements.

Wavefront coding ("WC") or phase masking is a technique used to engineer or otherwise alter the point spread function of an optical imaging system, or to change the angular sensitivity profile of an instrument. It has often been applied to make instruments more insensitive to optical aberrations such as defocus. It has also been commonly used to exclude on-axis light from a bright source by using a spiral phase plate ("SPP"), thereby, allowing observation of for example, extra-solar planets.

Aspheric optical elements are known to have advantages relative to spherical optics in reduced aberrations, fewer optical elements, but are expensive to manufacture. The manufacture of aspheres (or aspheric lens) is usually through precision molding or polishing, or through diamond machining. The surface quality that can be achieved for aspheric elements is less than that which can be achieved for spheric elements, due to the difficulty of fabricating a material with arbitrary surface profile. The use of aspheric elements in high-performance optical designs is now standard in the industry, despite their cost relative to spherical elements.

Diffractive optical elements are thin phase elements that are designed to, by means of interference and diffraction, produce arbitrary distributions of light or to aid in the design of optical systems. Diffractive lenses can be used, for example, to reduce the number of elements in conventional lens systems and eliminate the need for exotic materials in correcting chromatic aberrations. Applications of DOEs range from fiber optic communication to laser beam shaping.

All of the optical elements mentioned above have in common the use of material thicknesses to control the phase of a transmitted or reflected beam.

Figure 2A:
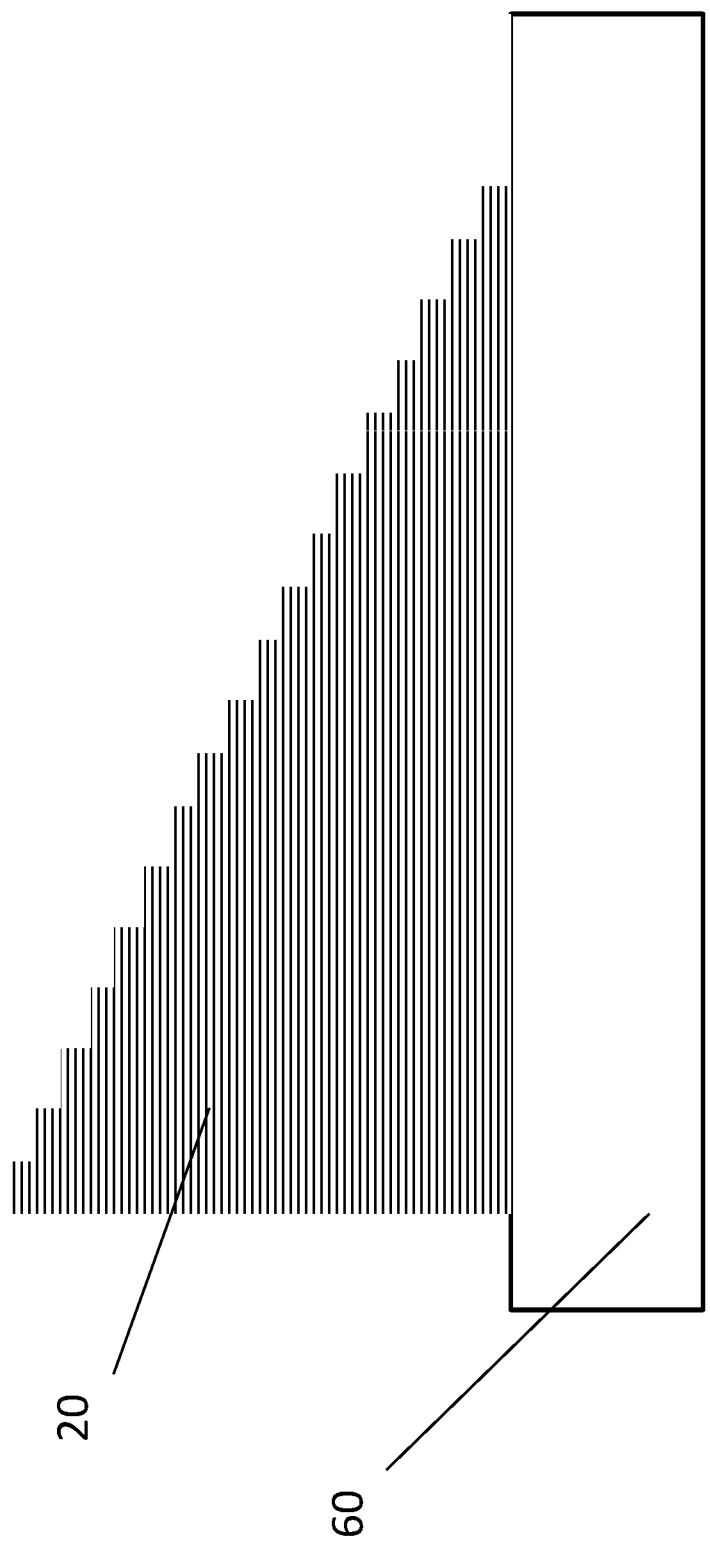
FIG. 2A is a cross-sectional view of an illustrative device including a focal plane array according to an embodiment of the invention.
Figure 2B:
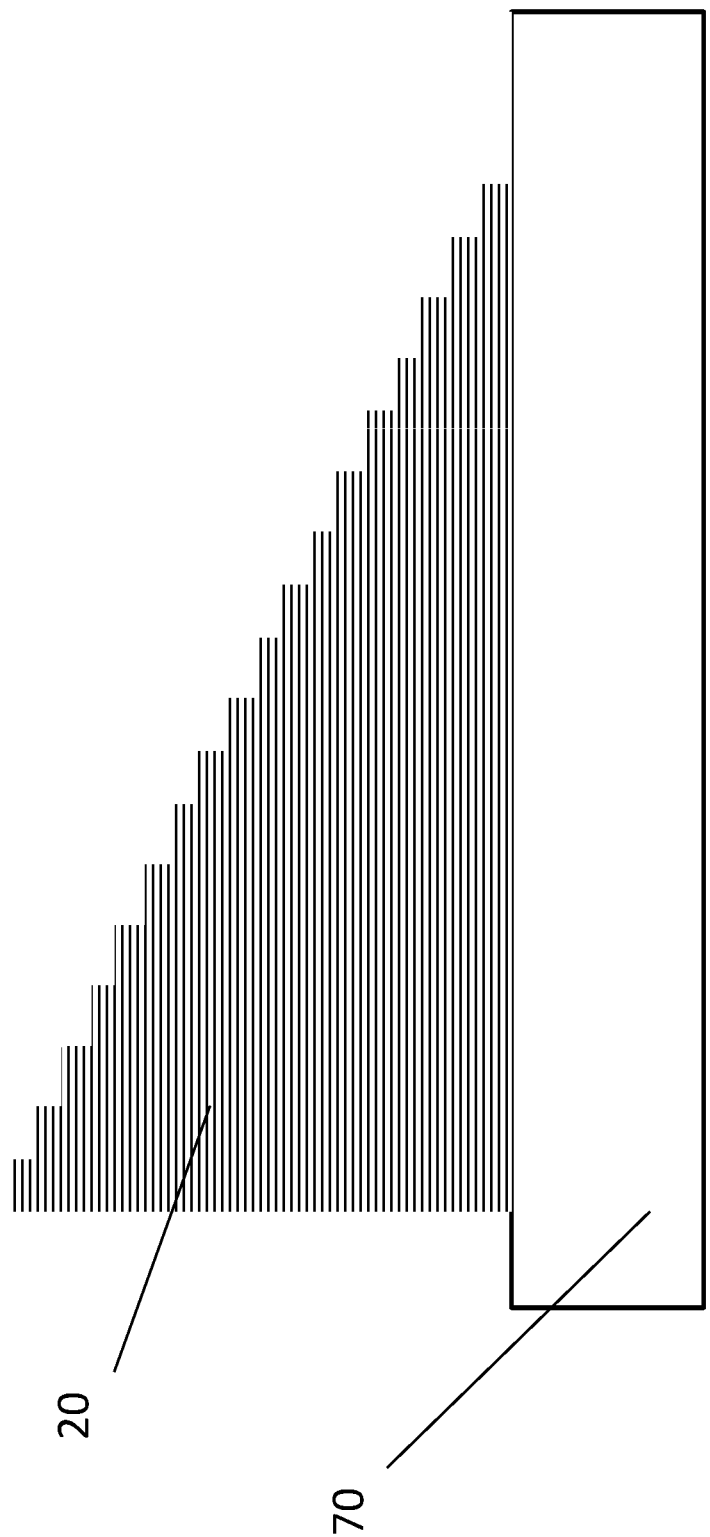
FIG. 2B is a cross-sectional view of an illustrative device including a CMOS imager according to an embodiment of the invention.
Figure 2C:
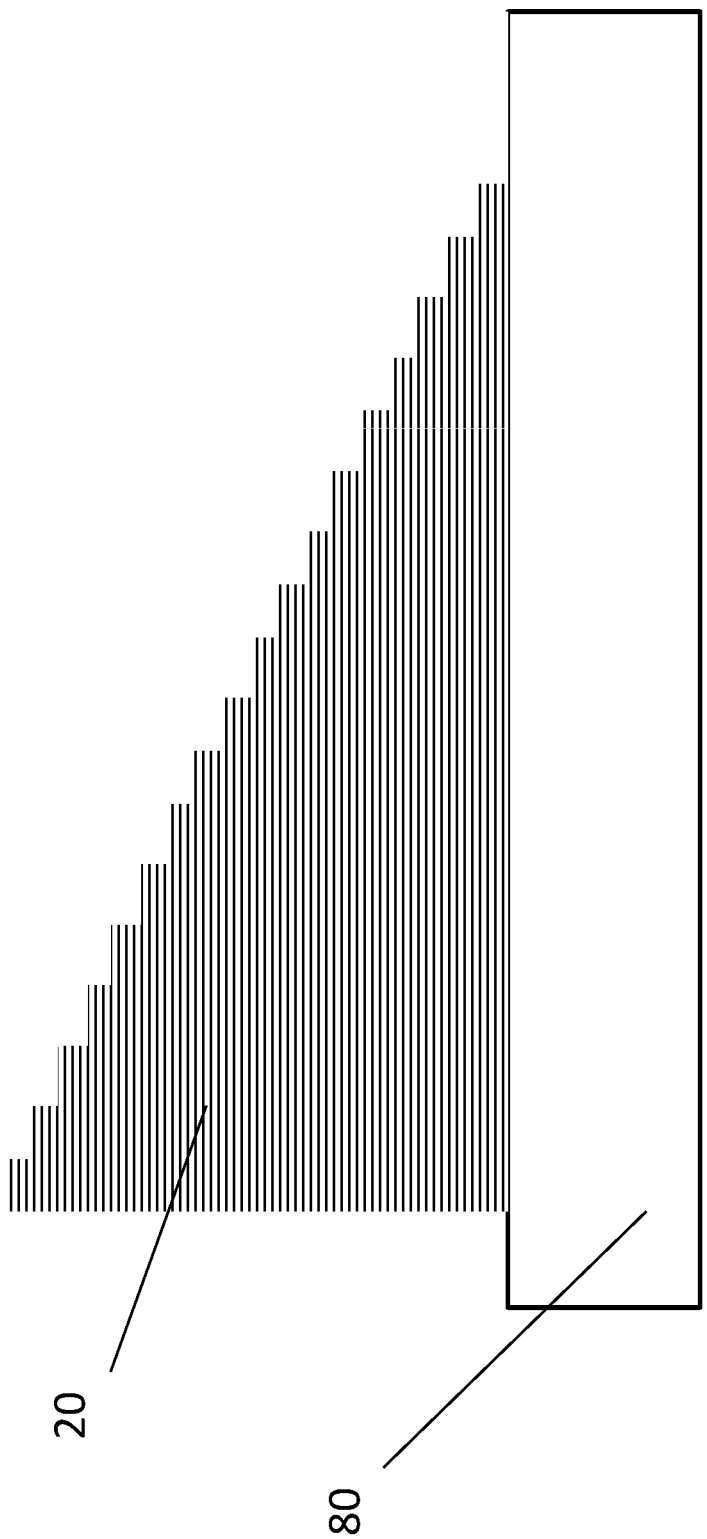
FIG. 2C is a cross-sectional view of an illustrative device including a CCD array according to an embodiment of the invention.

An embodiment of the invention includes a device that is described as follows, as shown by way of illustration in FIGS. 2A-2B. The device includes a surface profile optical element 10, including a substrate 30 and a plurality of bi-layer stacks 20 on the substrate, as shown by way of illustration in FIG. 2A. One of ordinary skill in the art will readily recognize that the surface profile optical element 10 includes, for example, a precise wavefront coding element, an aspheric optical element, and/or a diffractive optical element. Each bi-layer stack of the plurality of bi-layer stacks 20 includes a plurality of bi-layers, as shown by way of illustration in FIG. 2B. Each bi-layer of the plurality of bi-layers includes an etch-stop layer 40 and a bulk layer 50. The etch stop layer 40 includes an etch stop layer index of refraction. The bulk, layer 50 includes a bulk layer index of refraction. A ratio of the etch stop layer index of refraction and the bulk layer index of refraction is between 0.75 and 1.25.

Optionally, as shown by way of illustration in FIG. 2A-2D, the substrate 20 includes a standard fiscal plane array 60, a standard complementary metal-oxide-semiconductor ("CMOS") imager 70, a standard charge coupled device ("CCD") array 80, and a standard semiconductor device 90.

Optionally, substrate is transparent.

Optionally, the plurality of bi-layer stacks 20 includes a top surface roughness less than 10 nm root mean squared ("rms").

Optionally, the etch stop layer 40 includes alumina, and the bulk layer 50 includes a silicon-based dielectric, such as silicon dioxide and silicon nitride.

Optionally, at least one bi-layer stack of the plurality of bi-layer stacks 20 includes a thickness greater than 200 nm.

Figure 3:
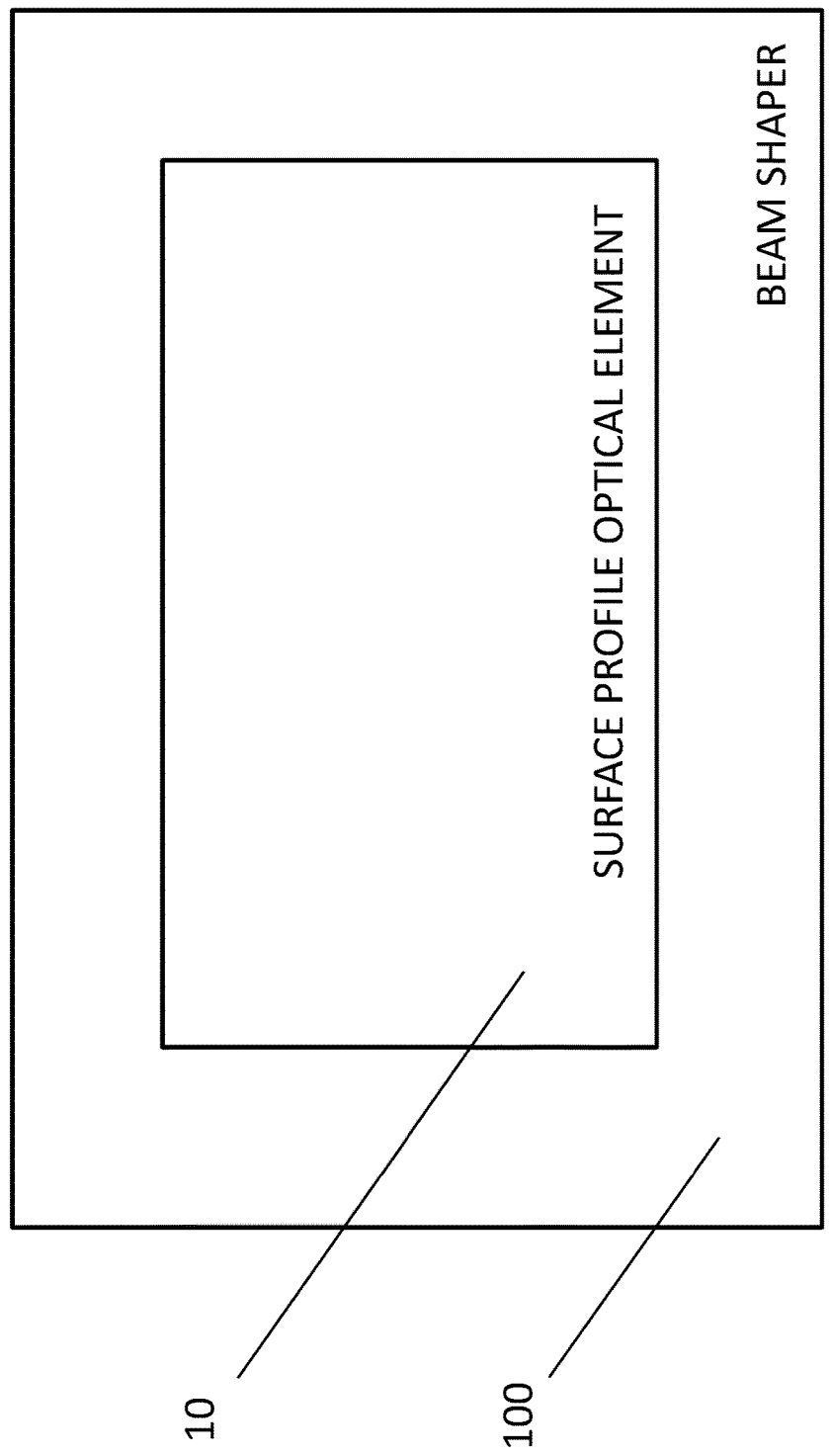
FIG. 3 is a block diagram of an illustrative device including a beam shaper according to an embodiment of the invention.
Figure 4A:
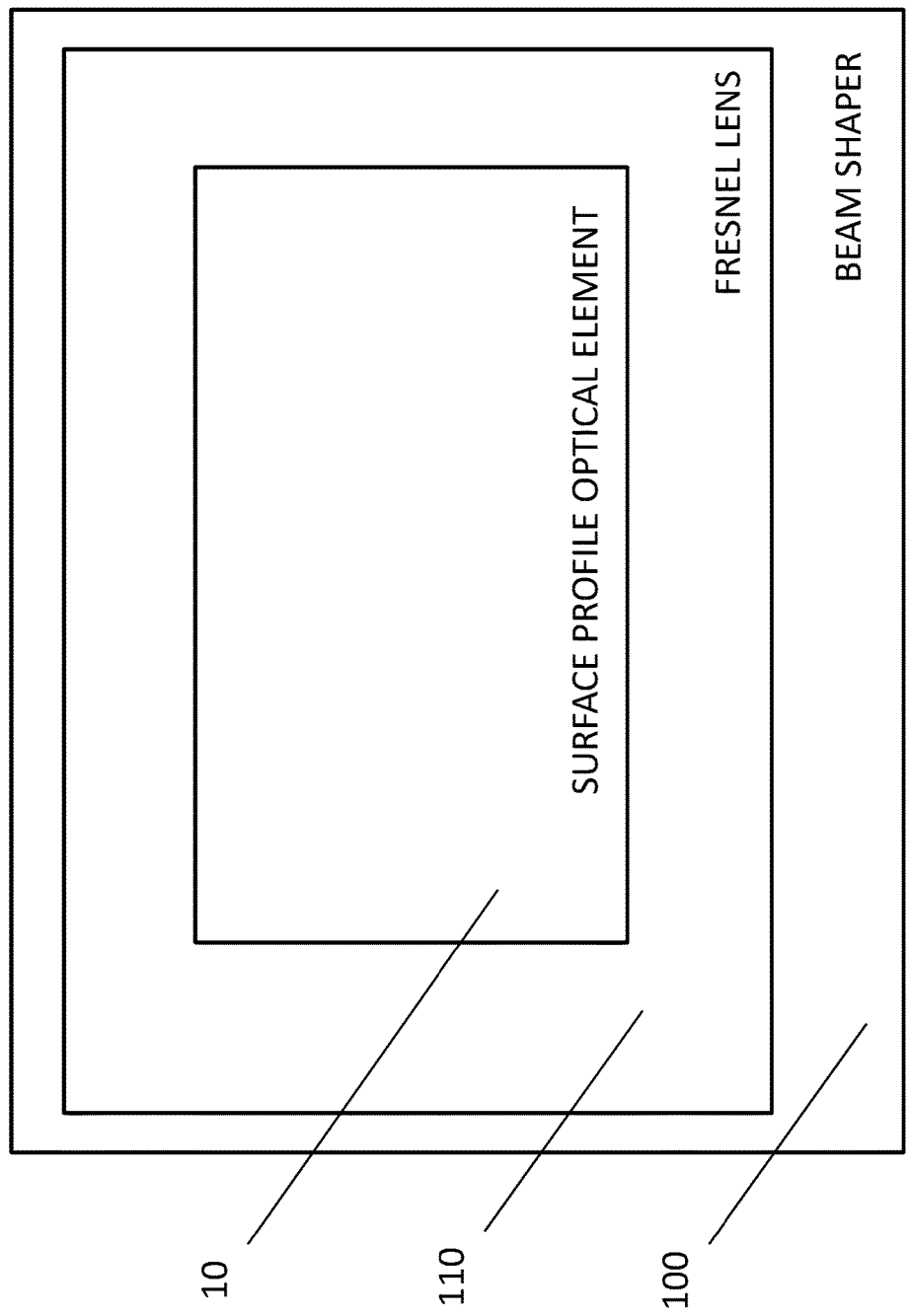
FIG. 4A is a cross-sectional view of an illustrative device including a beam shaper including a Fresnel lens according to an embodiment of the invention.
Figure 4B:
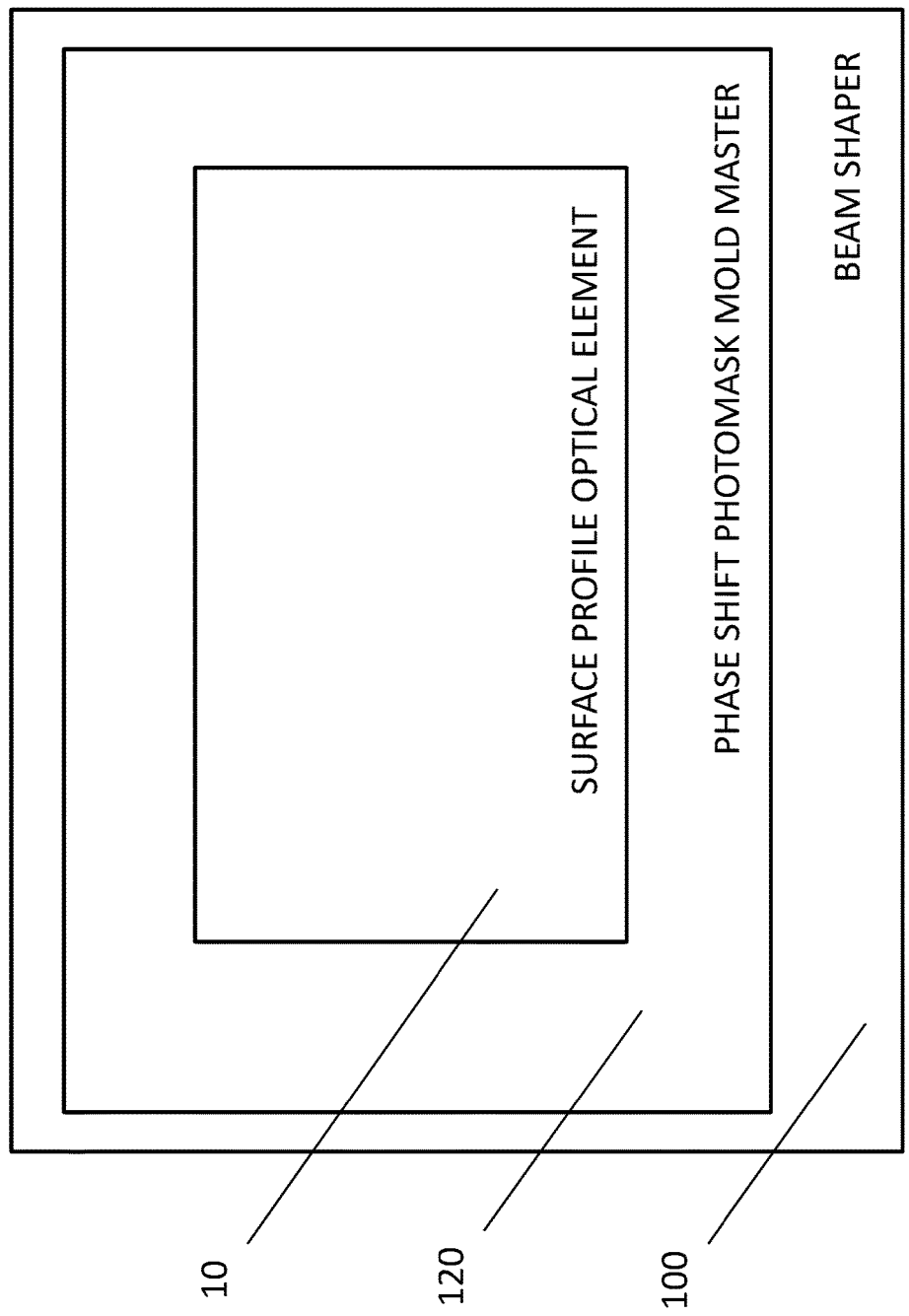
FIG. 4B is a cross-sectional view of an illustrative device including a phase shift photomask mold master according to an embodiment of the invention.
Figure 4C:
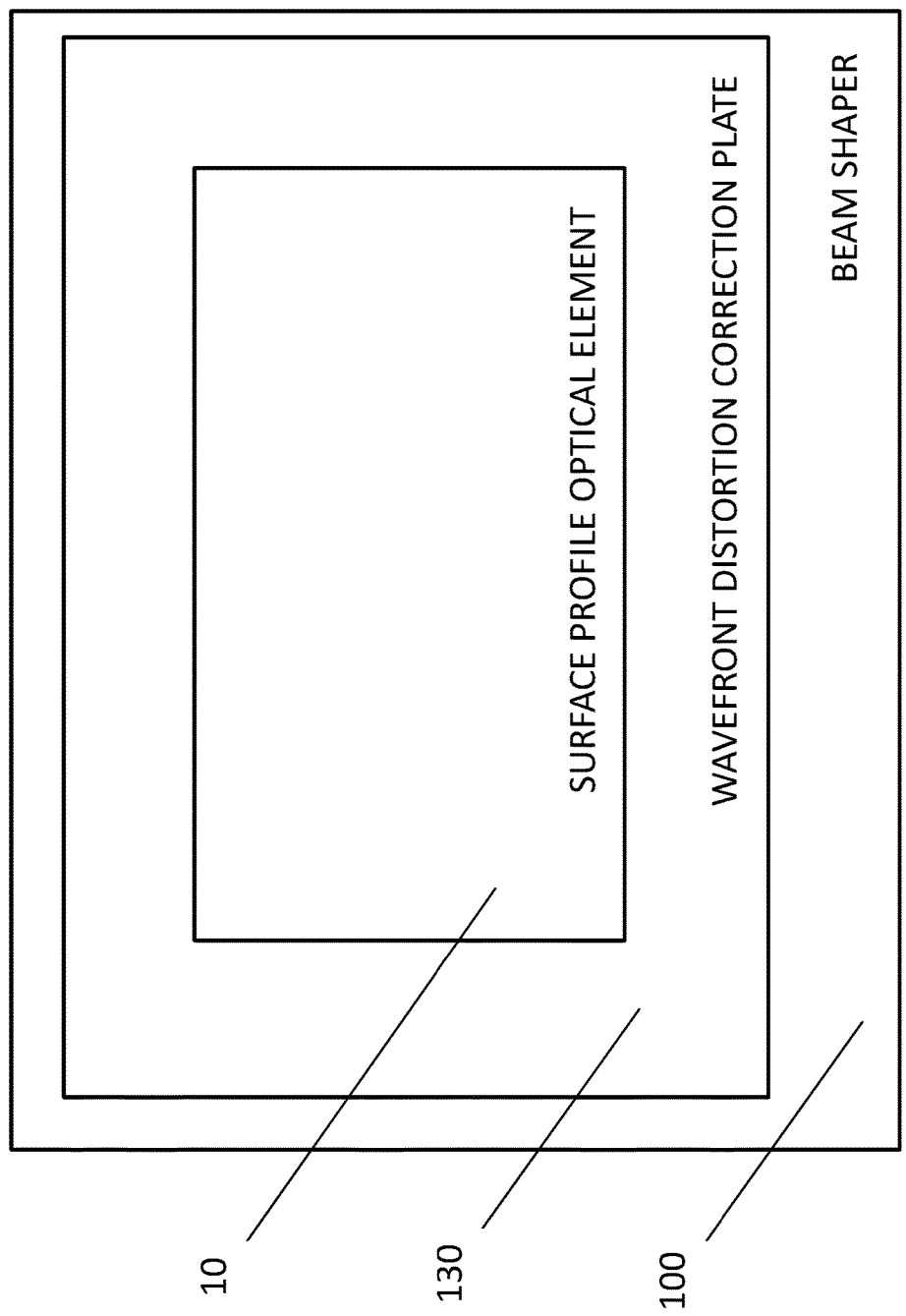
FIG. 4C is a cross-sectional view of an illustrative device including a wavefront distortion correction plate according to an embodiment of the invention.

Optionally, as shown by way of illustration in FIG. 3, the device further includes a standard beam shaper 100. The beam shaper 100 includes the surface profile optical element 10. Optionally, as shown by way of illustration in FIG. 4A, the beam shaper 100 includes a standard Fresnel lens 110. Optionally, as shown by way of illustration in FIG. 4B, the beam shaper 100 includes a standard phase shift photomask mold master 120. Optionally, as shown by way of illustration in FIG. 4C, the beam shaper 100 includes a standard wavefront distortion corrector plate.

Figure 5:
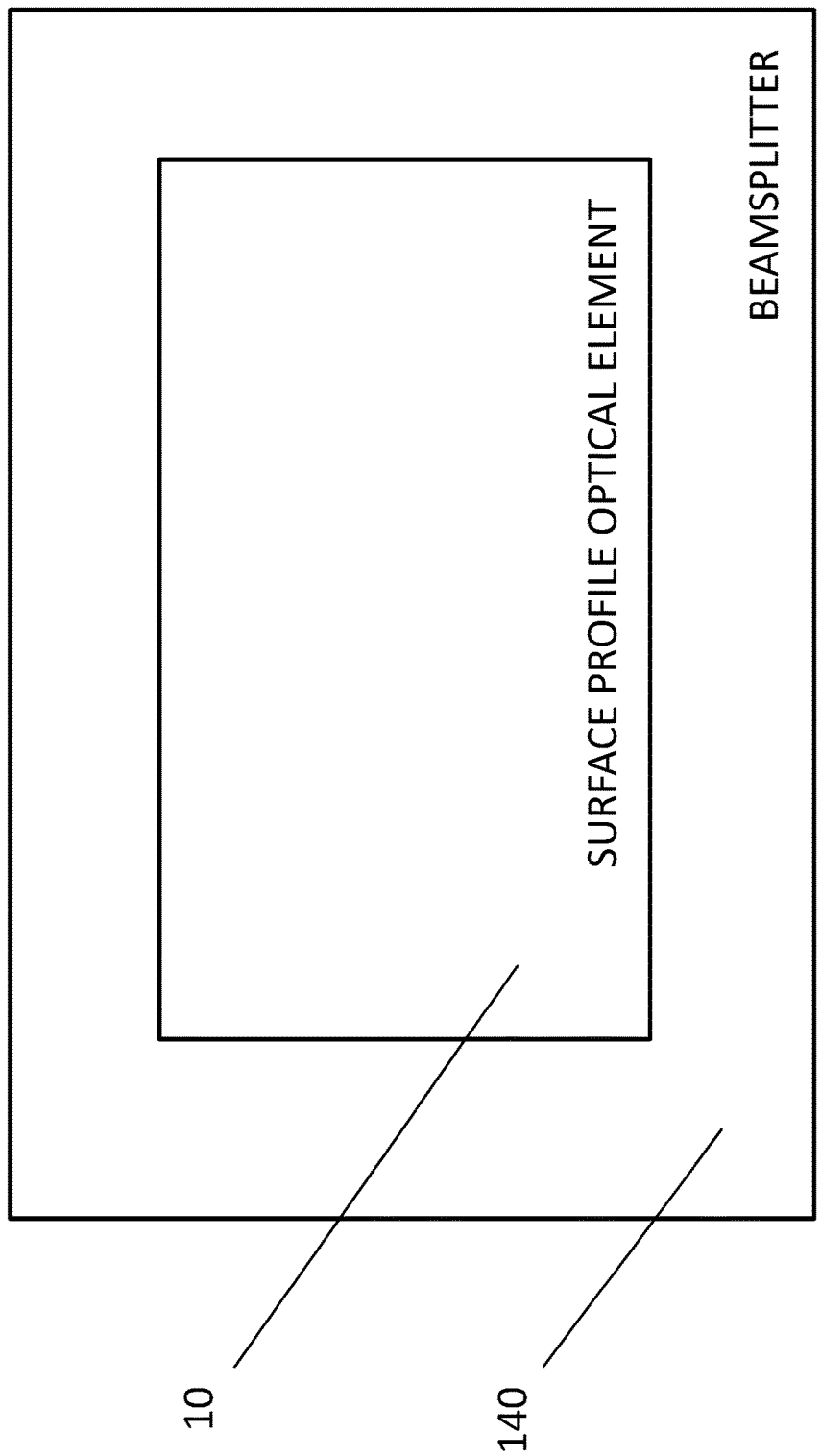
FIG. 5 is a cross-sectional view of an illustrative device including a beam splitter according to an embodiment of the invention.

Optionally, as shown by way of illustration in FIG. 5, the device further includes a standard beamsplitter 140. The beamsplitter 140 includes the surface profile optical element 10.

Figure 6:
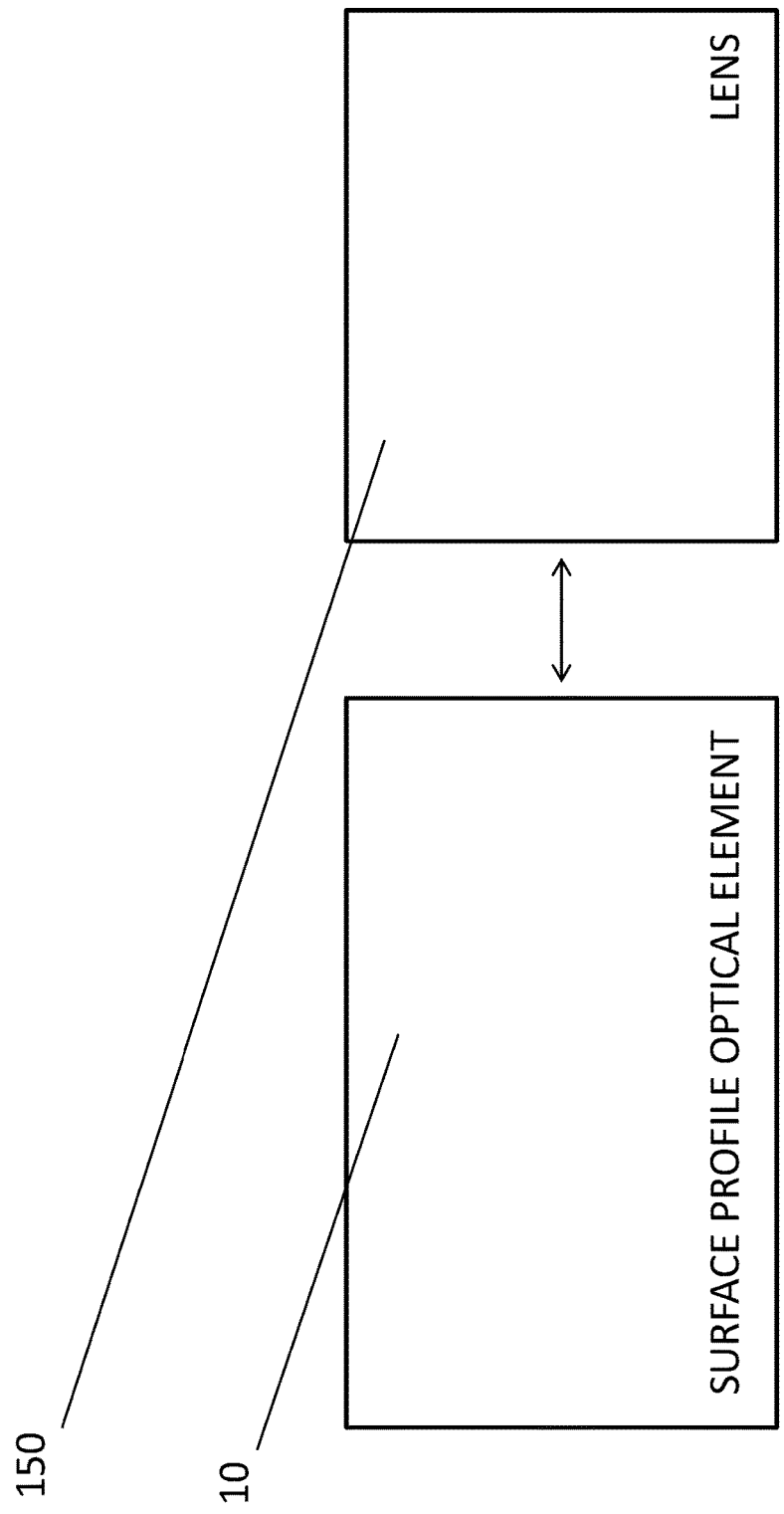
FIG. 6 is a cross-sectional view of an illustrative device including a surface profile optical element cooperating with a lens according to an embodiment of the invention.

Optionally, as shown by way of illustration in FIG. 6, the device further includes a standard lens 150, wherein the surface profile optical element 10 is operably connected to the lens. Optionally, the lens 150 includes a standard, optical transfer function, such as discussed in Goodman J., *Introduction to Fourier Optics*, Roberts & Co. 2005. The surface profile optical element 10, for example, includes a standard, wavefront coded surface for the lens 150, the wavefront coded surface modifying the optical transfer function. One of ordinary skill in the art will readily appreciate that the wavefront coding element is configured such that the combination of a modulation transfer function of the optics and the wavefront coding element exhibits reduced variation over a range of spatial frequencies.

Figure 7:
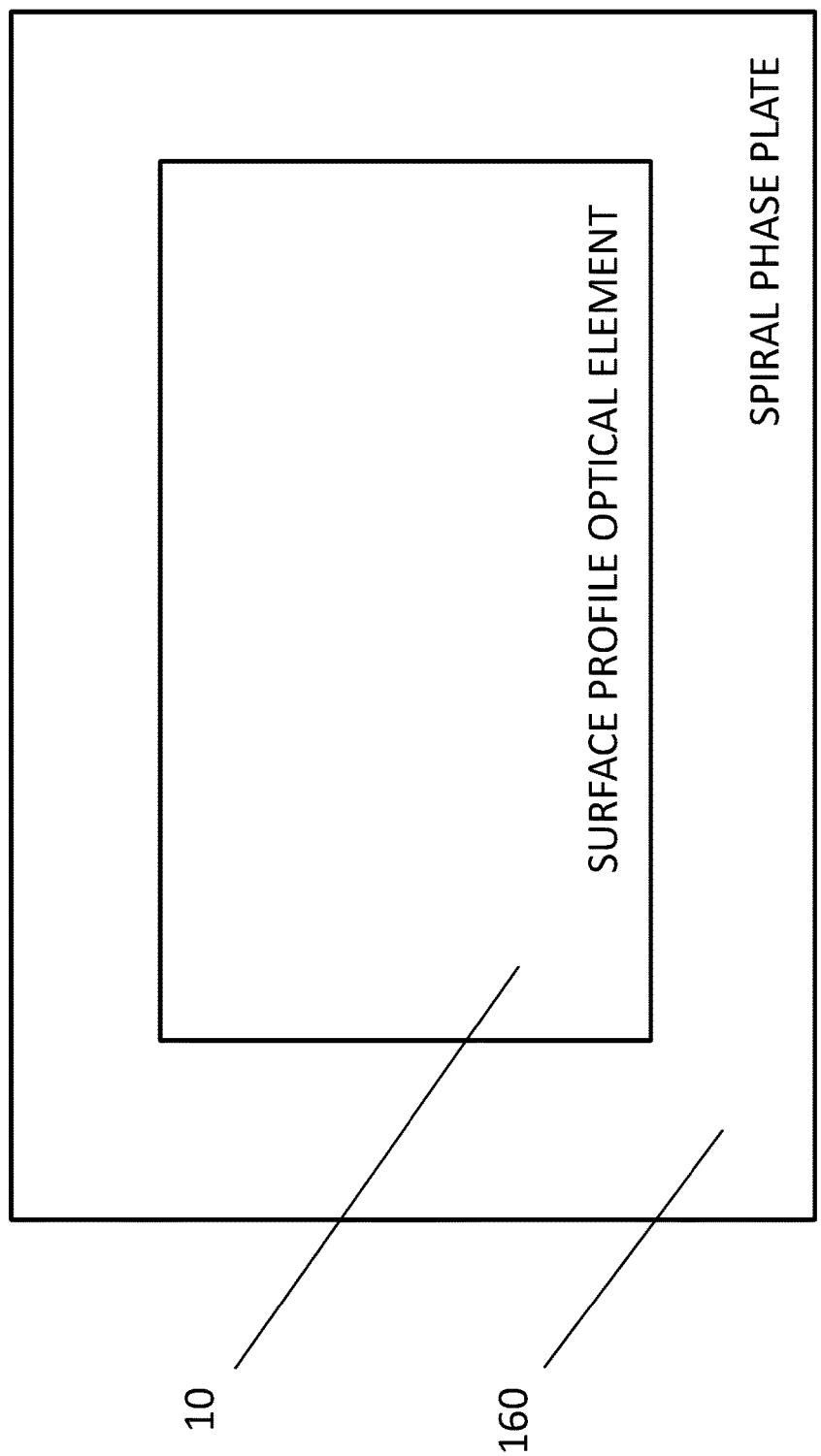
FIG. 7 is a cross-sectional view of an illustrative device including a spiral phase plate according to an embodiment of the invention.

Optionally, as shown by way of illustration in FIG. 7, the device further includes a standard, spiral phase plate 160, which includes the surface profile optical element 10.

Figure 8:
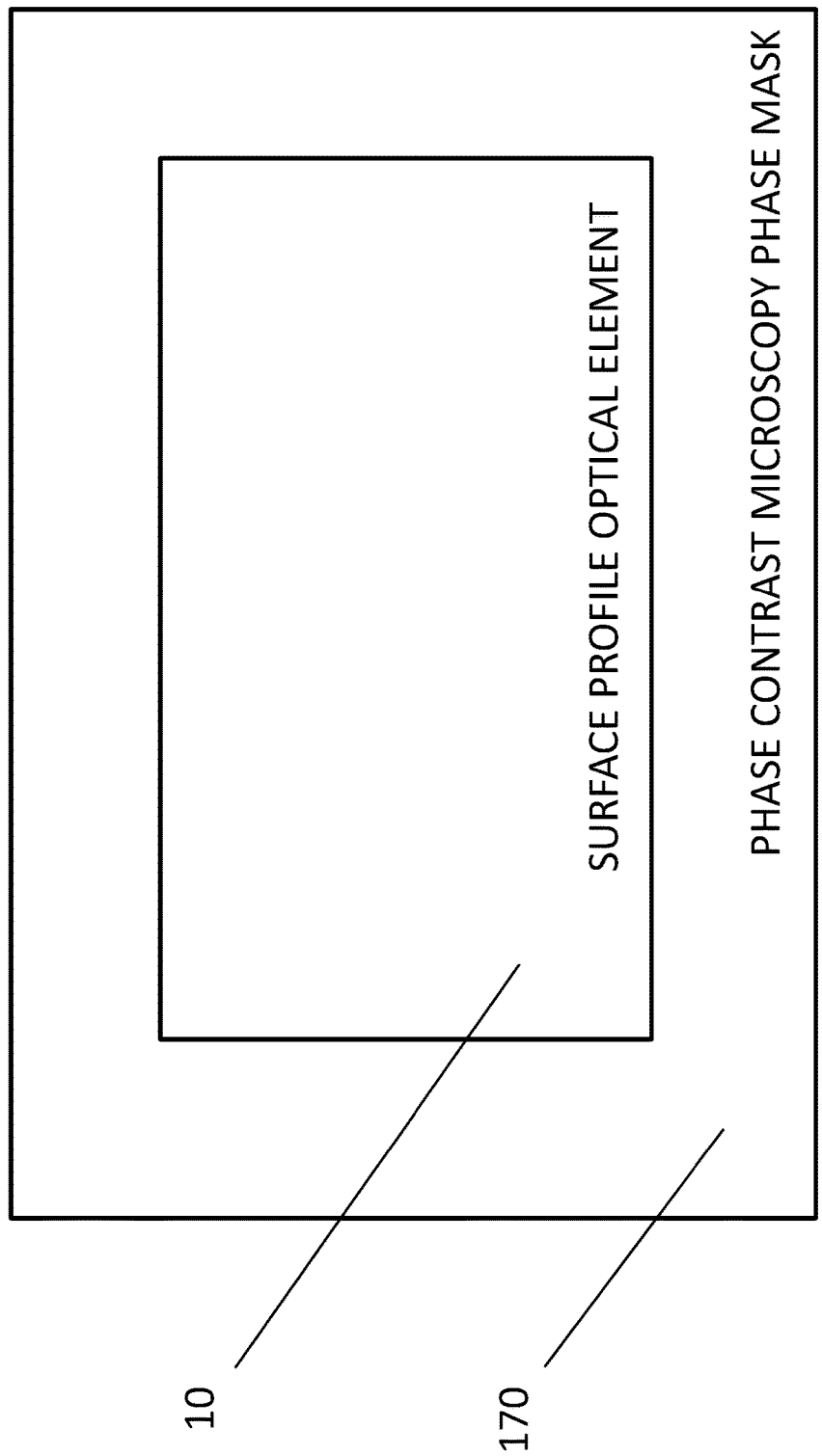
FIG. 8 is a cross-sectional view of an illustrative device including a phase contrast microscopy phase mask according to an embodiment of the invention.

Optionally, as shown by way of illustration in FIG. 8, the device further includes a standard, phase contrast microscopy phase mask 170, which includes the surface profile optical element 10.

Figure 9:
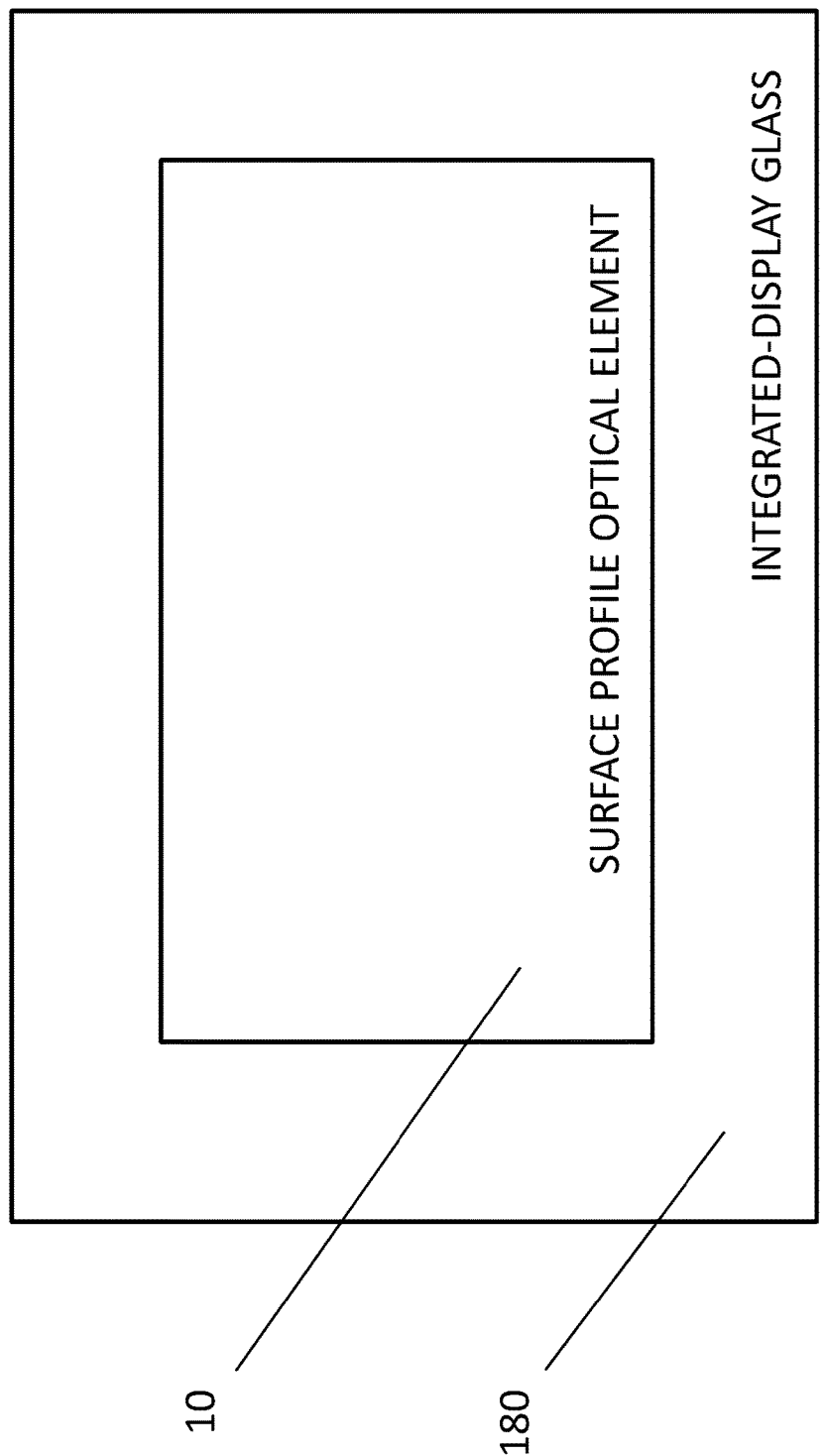
FIG. 9 is a cross-sectional view of an illustrative device including an integrated-display glass according to an embodiment of the invention.

Optionally, as shown by way of illustration in FIG. 9, the device further includes a standard, integrated-display glass 180, which includes the surface profile optical element 10. Optionally, the integrated-display glass 180 includes a standard window, a standard windshield, a standard helmet, and/or a standard eyeglass.

Figure 1A:
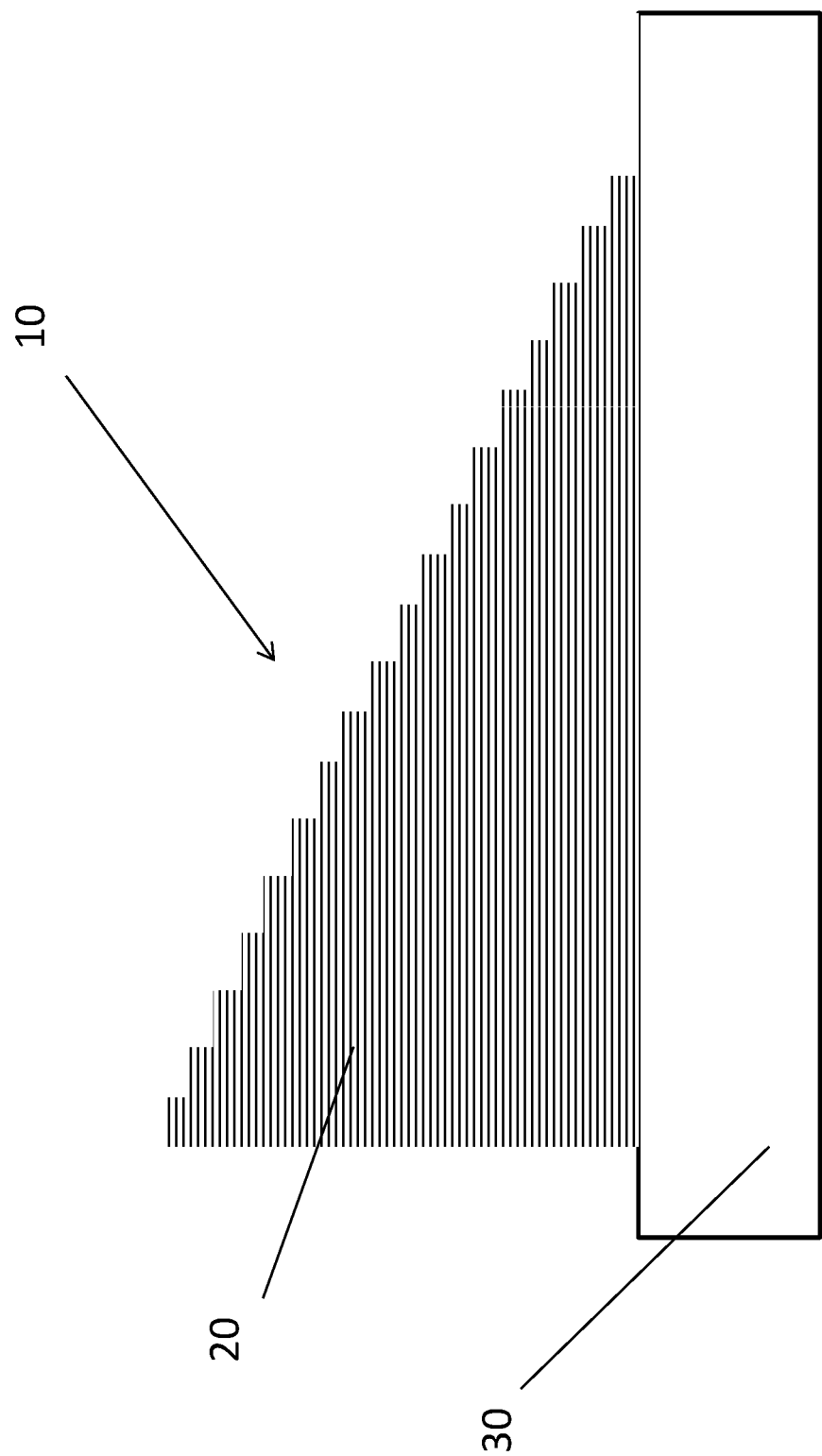
FIG. 1A is a cross-sectional view of an illustrative device including a surface profile optical element according to an embodiment of the invention.
Figure 1B:
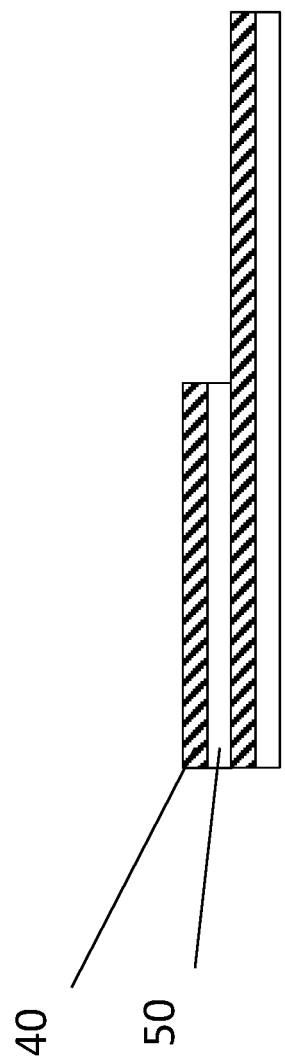
FIG. 1B is a cross-sectional view of magnified, cross-sectional view of two, illustrative bi-layers in a surface profile optical element of a device according to an embodiment of the invention.

Another embodiment of the invention includes a method of fabricating a multiple-step, surface profile optical element. The method is described as follows, with reference by way of illustration only to FIGS. 10A-10D. A stack of bi-layers 200 is deposited on a substrate 30, as shown by way of illustration in FIG. 10A. The stack of bi-layers 200 includes a plurality of bi-layers, as shown by way of illustration in FIG. 1B. Each bi-layer of the plurality of bi-layers includes an etch stop layer 40 and a bulk layer 50. The etch stop layer 40 and the bulk layer 50 have respective indices of refraction that approximate each other. For example, a ratio of the etch stop layer's index of refraction and the bulk layer's index of refraction is between 0.75 and 1.25. A three-dimensional photoresist structure 210, 215 is formed by using gray-tone lithography, as shown by way of illustration in FIG. 10B. The three-dimensional photoresist is plasma etched into the bi-layer stack, thereby generating at least one plasma-etched bi-layer stack 220, 225, as shown by way of illustration in FIG. 10C. For example, the plasma etching includes reactive ion etching. FIG. 10C shows, by way of exaggeration for the purpose of understanding, the surface roughness of the plasma-etched bi-layer stacks. FIG. 10C only shows two plasma-etched bi-layer stacks for ease of understanding. One of ordinary skill in the art will readily recognize that a practical surface profile optical element optionally, includes more than two bi-layer stacks. The at least one plasma-etched bi-layer stack 220, 225 is chemically etched with a first chemical etchant so as to generate a multiple-step, surface profile optical element, as shown by way of illustration in FIG. 10D. The first chemical etchant stops at the etch stop layer. FIG. 10D shows, by way of exaggeration for the purpose of understanding, the surface smoothness of the plasma-etched bi-layer stacks 230, 235. FIG. 10C only shows two chemically etched bi-layer stacks for ease of understanding. Again, one of ordinary skill in the art will readily recognize that a practical surface profile optical element optionally, includes more than two bi-layer stacks.

Figure 11A:
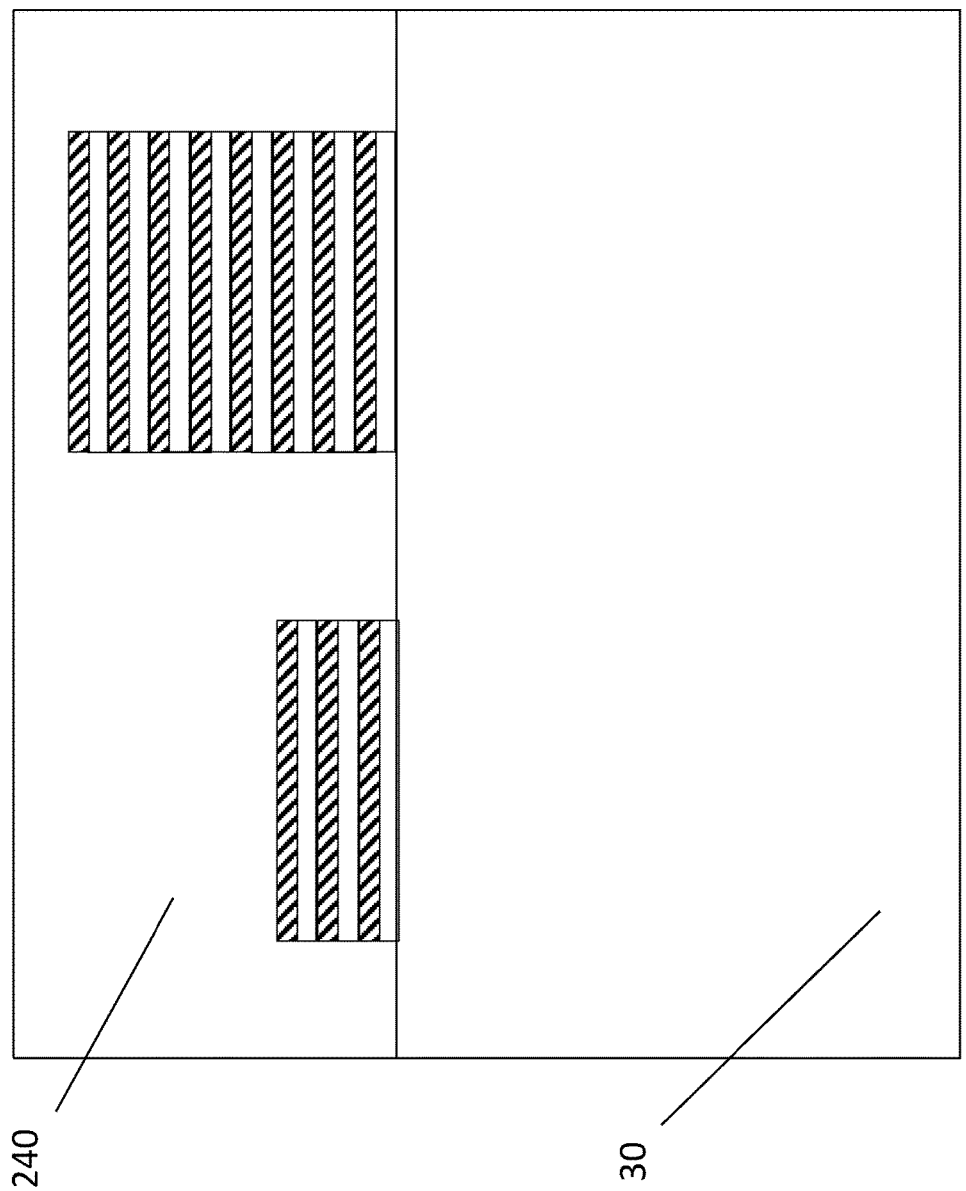
FIG. 11A is a cross-sectional view of an illustrative surface profile optical element being used as an illustrative mold master in a method according to an embodiment of the invention.
Figure 11B:
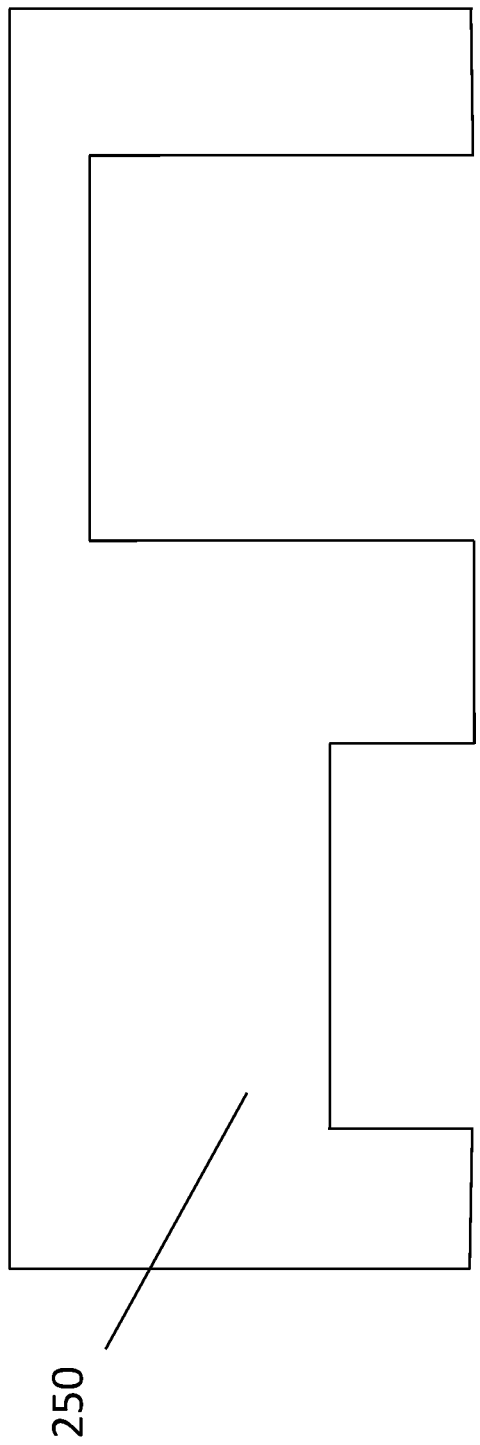
FIG. 11B is a cross-sectional view of an illustrative surface profile optical element-imprinted mold, made by a method according to an embodiment of the invention.

Optionally, the multi-step, surface profile optical element is provided as a mold master, as shown by way of illustration in FIGS. 11A-11B. A coating 240, or mold solution, is applied onto the mold master, as shown by way of illustration in FIG. 11A. Optionally, the coating includes a standard polymer, a standard plastic, a standard ceramic, and/or a standard glass. The coating is solidified. The solidified coating is removed, thereby generating a surface profile optical element-imprinted mold 250, as shown by way of illustration in FIG. 11B.

As to the mold master, an embodiment of the invention provides for the micro-fabrication of a mold-master with a low surface roughness. Under optimized molding conditions, this low roughness will "transfer" to the final workpiece.

Another embodiment of the invention includes a method of fabrication and is describes as follows, with reference by way of illustration to FIGS. 10A-10D. The key fabrication characteristic for DOEs is precise 3D surface topography. A fabrication sequence according to this embodiment of the invention is based on four basic process steps:
1) stack deposition;
2) gray-tone lithography;
3) structure transfer; and
4) selective chemical etching.

A stack of materials is deposited by standard thin film deposition techniques, e.g., low pressure chemical vapor deposition ("LPCVD"), plasma-enhanced chemical vapor deposition ("PECVD"), atomic layer deposition ("ALD"), or sputtering. The stack includes two materials: A and B. Material A is always deposited on top of Material B. The stack includes multiple A-B bi-layers. One of ordinary skill in the art will readily recognize that Material A and Material B must be selected such that their electrical properties match the application of the device constructed according to this embodiment of the invention. One or both materials of the stack (e.g. B) additionally act as an "etch stop," as described below. For example, silicon oxide ("$SiO_2$") and alumina ("$Al_2O_3$") are used as Materials A and B for the bi-layers for a particular application. Both materials are deposited by ALD with 15 nm and 5 nm thicknesses. As another example, PECVD-deposited silicon dioxide ("$SiO_2$") and silicon nitride ("$Si_3N_4$") are alternatively used as bi-layer materials for a different application. The number of design levels is determined by the number of bi-layers within the stack and the geometry of the gray-tone photoresist structure.

As to the choice of bi-layer materials, although the discussion above includes alumina/silicon dioxide and silicon nitride/silicon dioxide as material combinations for our bi-layer stack, one of ordinary skill in the art will readily recognize the utility of alternative material combinations for alternative applications. For example, a different dielectric material (e.g. a metal oxide) is optionally used for alternative applications. As another example, conducting layers are optionally used for alternative applications. The only common requirement for the material combinations is that one material can be selectively etched with respect to the other one.

As described above, standard gray-tone lithography is ideal for the fabrication of 3D microstructures. The developed photoresist is then processed, for example by standard etching, to reproduce a scaled version of the 3D microstructure on the substrate. As the etch proceeds, the photoresist mask slowly erodes, exposing the underlying dielectric to the high etch rate plasma. After transferring the gray-tone resist into the stack a standard chemical etch is performed. The standard chemical selectively only etches one material of the bi-layer (e.g. if Material A is etched, Material B is not). This selective chemical etch step will transform the 3D microstructure into distinct steps. For example, vapor HF (hydrofluoric acid) is used to etch $SiO_2$ selectively over the alumina (with an etch time of ~30 sec for a 15 nm $SiO_2$ layer). This leads to digitally distinct steps at a resolution controlled by the deposition of the bi-layer stack.

Because the last process step is a highly selective chemical etch, the top surface roughness for 3D microstructures fabricated according to this embodiment of the invention is extremely low. For example, an illustrative 3D microstructure as measured with atomic force microscopy ("AFM") evidences distinct levels of 0.3 nm rms surface roughness with controlled 3D features.

In another example of a method according to this embodiment of the invention, the gray-tone lithography uses a Novolak resist (AZ P4330 Clariant, ~3 μm thick). According to a standard soft-bake procedure, the wafer, or substrate, is heated to 100° C. for 60 s on a hotplate to remove solvents from the resist prior to UV exposure. "Diffuser-based" gray-tone lithography is used with a 15 second exposure time. According to standard development procedures, the standard resist is developed using the standard puddle method. 1:4 de-ionized ("DI") water to 400K AZ developer is used for ~40 sec and is followed by a thorough DI water rise. After development, the resist is hard-baked at 150° C. for 120 seconds. The hard-bake makes the resist more resistant during a subsequent reactive-ion etching ("RIE") etching step.

The gray-tone resist patterns are transferred into the stack via an inductively coupled plasma ("ICP") RIE etch step. The ICP etch was performed using an Oxford 100 fluorine etcher (30 sccm $CF_4$, 20 mTorr, 20 W FW power, 500 W ICP power, 90 min etch time).

Vapor HF (hydrofluoric acid) is used for the chemical etching (e.g., using a Primaxx Etch System). Vapor HF only etches the silicon oxide and leaves the alumina intact. Hydrofluoric acid's reaction with $SiO_2$ forms water acting as a catalyst which will cause aqueous HF to etch the alumina. Commercial HF vapor etch systems minimize the formation of HF(aqu.) by injecting alcohol into the system. Optionally, diluted phosphoric acid etch steps (70 C) are added. The phosphoric acid etches the alumina layer.

For an oxide/nitride stack, boiling phosphoric acid is used to etch the nitride layer. The $SiO_2$ is again etched using vapor HF.

As to chemical etching, although the discussion above includes the use of vapor HF to perform the selective chemical etching, one of ordinary skill in the art will readily recognize the utility of alternative standard wet or dry (e.g., reactive ion etch or ion-milling) etching techniques.

As to gray-tone lithography, although the discussion above includes a HEBS mask and diffuser based gray-tone lithography, one of ordinary skill in the art will readily recognize the utility of alternative standard ways to generate a 3D resist profile.

As to multiple lithography etching step cycles, one of ordinary skill in the art will readily recognize the utility of multiple lithography etching step cycles on a bi-layer stack. After the last etch step, the chemical etch step would generate a surface with a low surface roughness.

Although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

This written description sets forth the best mode of the invention and provides examples to describe the invention and to enable a person of ordinary skill in the art to make and use the invention. This written description does not limit the invention to the precise terms set forth. Thus, while the invention has been described in detail with reference to the examples set forth above, those of ordinary skill in the art may effect alterations, modifications and variations to the examples without departing from the scope of the invention.

These and other implementations are within the scope of the following claims.

What is claimed as new and desired to be protected by Letters Patent of the United States is:

1. A device comprising:
   a surface profile optical element comprising a substrate and a plurality of bi-layer stacks on said substrate, each bi-layer stack of said plurality of bi-layer stacks comprising a plurality of bi-layers, each bi-layer of said plurality of bi-layers comprising an etch-stop layer and a bulk layer, said etch stop layer comprising an etch stop layer index of refraction, said bulk layer comprising a bulk layer index of refraction, a ratio of said etch stop layer index of refraction and said bulk layer index of refraction being between 0.75 and 1.25,
   wherein said plurality of bi-layer stacks comprise a top surface roughness less than 10 nm root mean squared.

2. The device according to claim 1, wherein said substrate comprises one of a focal plane array, a CMOS imager, a CCD array, and a semiconductor device,
   wherein said surface profile optical element comprises one of a wavefront coding element, an aspheric optical element, and a diffractive optical element.

3. The device according to claim 1, wherein said substrate is transparent.

4. The device according to claim 1, wherein said etch stop layer comprises alumina, and said bulk layer comprises a silicon-based dielectric.

5. The device according to claim 1, wherein at least one bi-layer stack of said plurality of bi-layer stacks comprises a thickness greater than 200 nm.

6. The device according to claim 1, further comprising a beamsplitter, said beamsplitter comprising said surface profile optical element.

7. The device according to claim 1, further comprising:
   an integrated-display glass comprising said surface profile optical element.

8. The device according to claim 7, wherein said integrated-display glass comprises one of a window, a windshield, a helmet, and an eyeglass.

9. The device according to claim 1, further comprising a beam shaper, said beam shaper comprising said surface profile optical element.

10. The device according to claim 9, wherein said beam shaper comprises a Fresnel lens.

11. The device according to claim 9, wherein said beam shaper comprises a phase shift photomask mold master.

12. The device according to claim 9, wherein said beam shaper comprises a wavefront distortion corrector plate.

13. The device according to claim 1, further comprising:
    a lens,
    wherein said surface profile optical element is operably connected to said lens.

14. The device according to claim 13, wherein said lens comprises an optical transfer function,
    wherein said surface profile optical element comprises a wavefront coded surface for said lens, said wavefront coded surface modifying the optical transfer function.

15. The device according to claim 13, further comprising:
    a spiral phase plate comprising said surface profile optical element.

16. The device cording to claim 13, further comprising:
    a phase contrast microscopy phase mask comprising said surface profile optical element.

17. A method of fabricating a multiple-step, surface profile optical element, the method comprising: depositing a bi-layer stack on a substrate, the bi-layer stack comprising a plurality of bi-layers, each bi-layer of the plurality of bi-layers comprising an etch stop layer and a bulk layer, wherein the etch stop layer and the bulk layer have respective indices of refraction that approximate each other, forming a three-dimensional photoresist structure by using gray-tone lithography; plasma etching the three-dimensional photoresist into the bi-layer stack, thereby generating an etched bi-layer stack; and chemically etching the etched bi-layer stack with a first chemical etchant so as to generate a multiple-step, surface profile optical element, wherein the first chemical etchant stops at the etch stop layer.

18. The method according to claim 17, further comprising:
    providing the multi-step, surface profile optical element as a mold master;
    applying a coating onto the mold master;
    solidifying the coating, and
    removing the solidified coating thereby generating a surface profile optical element-imprinted mold.

19. The method according to claim 18, wherein said coating includes at least one of a polymer, a plastic, a ceramic, and a glass.

* * * * *